(12) United States Patent
Mashino

(10) Patent No.: US 7,909,976 B2
(45) Date of Patent: Mar. 22, 2011

(54) METHOD FOR FILLING THROUGH HOLE

(75) Inventor: Naohiro Mashino, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 636 days.

(21) Appl. No.: 11/645,580

(22) Filed: Dec. 27, 2006

(65) Prior Publication Data

US 2007/0170065 A1 Jul. 26, 2007

(30) Foreign Application Priority Data

Dec. 28, 2005 (JP) .............................. P.2005-378638

(51) Int. Cl.
*C25D 5/18* (2006.01)
*C25D 5/02* (2006.01)

(52) U.S. Cl. ........................................ 205/104; 205/118

(58) Field of Classification Search .................. 205/104, 205/108, 118, 133, 159, 183
See application file for complete search history.

(56) References Cited

U.S. PATENT DOCUMENTS

| 4,534,832 | A * | 8/1985 | Doiron, Jr. ...................... 205/96 |
| 4,666,567 | A * | 5/1987 | Loch .............................. 205/83 |
| 5,656,139 | A * | 8/1997 | Carey et al. .................... 204/222 |
| 6,261,433 | B1 * | 7/2001 | Landau ........................... 205/96 |
| 6,297,155 | B1 * | 10/2001 | Simpson et al. ............... 438/687 |
| 6,451,195 | B1 * | 9/2002 | Watanabe ....................... 205/89 |
| 6,458,696 | B1 * | 10/2002 | Gross .............................. 438/668 |
| 6,793,796 | B2 * | 9/2004 | Reid et al. ...................... 205/102 |
| 2004/0045832 | A1 * | 3/2004 | Martyak ........................ 205/131 |
| 2005/0051436 | A1 * | 3/2005 | Chen et al. ..................... 205/125 |

FOREIGN PATENT DOCUMENTS

| JP | 62077494 A | 4/1987 |
| JP | 4147694 A | 5/1992 |
| JP | 5331697 A | 12/1993 |
| JP | 2003253490 A | 9/2003 |
| JP | 2005093934 A | 4/2005 |
| WO | WO 03/033775 A1 | 4/2003 |

OTHER PUBLICATIONS

Lowenheim (Electroplating, McGraw-Hill Book Co., New York, 1978, pp. 12-13).*

* cited by examiner

*Primary Examiner* — Luan V Van
(74) *Attorney, Agent, or Firm* — Drinker Biddle & Reath LLP

(57) ABSTRACT

It is characterized in that in the case of filling a through hole formed in a substrate with a plated metal by electrolytic plating, the electrolytic plating is started by a high current density higher than Constant Current Density capable of fully filling the through hole when the electrolytic plating is performed with a current density held constant as a current density of the electrolytic plating, and the electrolytic plating is continued by being changed to a current density lower than the high current density by the time of reaching formation of a seam diameter in which an inside diameter does not decrease even when the electrolytic plating is continued after the electrolytic plating at the high current density is started.

11 Claims, 4 Drawing Sheets

METHOD FOR FILLING THROUGH HOLE

TECHNICAL FIELD

The present disclosure relates to a method for filling a through hole, and more particularly to a through hole filling method for filling a through hole with a plated metal by electrolytic plating using a metal thin film with which the whole surface of a substrate in which the through hole is formed is covered as a power feeding layer.

RELATED ART

In a substrate used in an electronic component of a semiconductor device etc., a via extending through the substrate is formed and conductor patterns formed on both surfaces of the substrate are electrically connected.

A formation method of such via includes, for example, a method for forming the via by filling a through hole extending through a substrate with a plated metal by electrolytic plating. This method is shown in FIG. 4. In the method shown in FIG. 4, after a cylindrical through hole 102 is first formed in a substrate 100 made of insulating material as shown in FIG. 4(a), a thin film metal layer 104 is formed on a surface of the substrate 100 including an inner wall surface of the through hole 102 by electroless plating as shown in FIG. 4(b).

Further, electrolytic plating using the thin film metal layer 104 as a power feeding layer is performed and a plated metal layer 106 is formed on the inner wall surface of the through hole 102 and an exposed surface of the thin film metal layer 104. This electrolytic plating first proceeds so that a thickness ($t_{in}$) of the plated metal layer formed on the inner wall surface of the through hole 102 becomes equal to a thickness ($t_{out}$) of the plated metal layer formed on a substrate surface in which the through hole 102 is opened as shown in FIG. 4(c).

When such electrolytic plating proceeds, a seam diameter in which an inside diameter of the through hole 102 does not decrease even in the case of further performing the electrolytic plating is reached as shown in FIG. 4(d). Herein, in the specification, the term "seam diameter" means the limit (or a space remained/formed in the center of the through hole) at which in electrolytic plating of the through hole, the through hole is not filled with plated metal any more (or an inside diameter of the through hole dose not decrease any more).

Even when the electrolytic plating is continued under the same condition after the inside diameter of the through hole 102 reaches the seam diameter thus, though the inside diameter of the through hole 102 does not decrease, a current density concentrates in the vicinity of the corner of an opening of the through hole 102 and the vicinity of the corner of the opening of the through hole 102 is filled with the plated metal and a void 108 is formed in the vicinity of the center of a via as shown in FIG. 4(e).

Such a seam diameter tends to become large as a current density of electrolytic plating becomes high, so that a through hole was filled with plated metal by electrolytic plating of a low current density in order to form a via without a defect such as a void in related-art.

However, when plating filling of the through hole by the electrolytic plating is performed at the low current density, it takes a long time to complete the filling.

Moreover, a via becomes finer with fineness of a wiring pattern by large scale integration etc. of a semiconductor device of recent years. As a result of this, a through hole forming the via also becomes finer and when the through hole becoming finer is filled with plated metal by electrolytic plating, a lower current density must be adopted and it takes a longer time to complete the filling of the through hole.

With respect to such a method for filling the related-art through hole, a method for filling a through hole by electrolytic plating in which electrode polarity is reversed periodically as shown in FIG. 5 is proposed in the following Patent Reference 1.

In this electrolytic plating, by applying reverse electrolysis for a short time at predetermined intervals, a component adsorbed to a thin film metal layer of the vicinity of an opening of a through hole is peeled and polarization resistance of the inside of the through hole at the time of positive electrolysis is held lower than that of the vicinity of the opening and a plated metal layer with a uniform thickness attempts to be formed inside the through hole.

[Patent Reference 1] International Publication No. 03/033775, Pamphlet

According to the electrolytic plating proposed in Patent Reference 1, a via in which the inside of a through hole is fully filled with a plated metal can be formed even when a current density at the time of positive electrolysis is relatively increased.

However, in this electrolytic plating, reverse electrolysis is applied and a part of the plated metal layer is peeled and it is necessary to hold polarization resistance of the inside of the through hole at the time of positive electrolysis lower than that of the vicinity of the opening, so that it is necessary to delicately control time and timing at which the reverse electrolysis is applied.

As a result of this, the method for filling the through hole with the plated metal by such electrolytic plating is actually difficult to use industrially combined with complication as an electrolytic plating apparatus.

SUMMARY

Embodiments of the present invention provide a through hole filling method which can reduce time taken to complete filling of a through hole with a plated metal and is easy to use industrially.

As a result of making a study in order to solve the problem, the present inventor has found the fact that as compared with the case of continuing electrolytic plating at a low current density, plating time taken to complete filling of a through hole with a plated metal can be reduced by being switched to electrolytic plating at a low current density by the time when a diameter of the through hole reaches a seam diameter even when electrolytic plating at a high current density is performed on a substrate in which the through hole is formed at a point in time of starting the plating, and has reached the invention.

That is, according to one or more embodiments of the invention is a method for filling a through hole, characterized in that in the case of filling a through hole formed in a substrate with a plated metal by electrolytic plating, the electrolytic plating is started by a high current density higher than Constant Current Density capable of fully filling the through hole when the electrolytic plating is performed with a current density held constant as a current density of the electrolytic plating and the electrolytic plating is continued by being changed to a current density lower than the high current density by the time of reaching formation of a seam diameter in which an inside diameter does not decrease even when the electrolytic plating is continued after the electrolytic plating at the high current density is started.

In the invention, a high current density at which an initial value of throwing power represented by a ratio [($t_{in}/t_{out}$)×100]

between a thickness ($t_{in}$) of a plated metal layer formed on an inner wall surface of a through hole and a thickness ($t_{out}$) of a plated metal layer formed on a substrate surface in which the through hole is opened can maintain 90% or more is adopted as the high current density and thereby, the through hole can surely be filled with a plated metal.

Further, a current density is changed stepwise from an initial high current density to a current density of Constant Current Density or less and thereby, the current density can easily be changed.

It is particularly preferable that a through hole should be set at a through hole with an inside diameter of 60 to 70 μm and when the inside diameter reaches about 10 μm by a plated metal layer formed on an inner wall surface of the through hole, a current density should be set at 0.9 A/cm$^2$ or less.

Also, a substrate in which plural through holes with the same inside diameter are formed is used as a substrate and changes are sequentially made stepwise from an initial high current density to a current density of Constant Current Density or less and thereby, the through holes can easily be filled with a plated metal.

On the other hand, a substrate in which plural through holes with different inside diameters are formed is used as a substrate and filling of a large inside diameter through hole group made of the through holes having large inside diameters with a plated metal is completed after filling of a small inside diameter through hole group made of the through holes having small inside diameters of the substrate with a plated metal is completed and thereby, the plural through holes with different inside diameters can also be filled with the plated metal.

In this case, electrolytic plating of a small inside diameter through hole group is performed while its current density is decreased sequentially from a high current density and after filling of the small inside diameter through hole group with a plated metal is completed, the current density is changed to a current density higher than the filling current density at which the filling of the small inside diameter through hole group is completed and subsequently electrolytic plating of the large inside diameter through hole group is performed while its current density is decreased sequentially from the high current density, and filling of the large inside diameter through hole group with a plated metal is completed and thereby, the plural through holes with different inside diameters can sufficiently be filled with the plated metal. Also, plating time can be reduced.

Here, a difference between inside diameters of through holes forming the same through hole group is set at less than 10 μm and thereby, all the through holes of the same through hole group can sufficiently be filled with a plated metal by electrolytic plating performed while a current density is decreased sequentially from a high current density.

Further, a difference between an inside diameter of a through hole with the maximum inside diameter of a small inside diameter through hole group and an inside diameter of a through hole with the minimum inside diameter of a large inside diameter through hole group is set at 10 μm or more and thereby, the through holes of the large inside diameter through hole group can sufficiently be filled with a plated metal by electrolytic plating performed while a current density is decreased sequentially from this high current density after being changed to a current density higher than a filling current density at which filling of the small inside diameter through hole group is completed.

In the invention, in the case of performing electrolytic plating while a plating solution is sprayed on a plated target surface of a substrate, the plating solution is sprayed from plural injection openings formed in a parallel part disposed in parallel with the plated target surface of a second supply pipe disposed in U shape in a first supply pipe for supplying the plating solution and thereby, the plating solution can be sprayed uniformly from each of the injection openings.

In this case, parallel parts of a second supply pipe in which plural injection openings are formed are arranged in both sides of a substrate so that a plating solution can be sprayed on plated target surfaces of both sides of the substrate and also, each of the parallel parts is disposed in a position in which jets of the plating solutions injected from the injection openings do not cancel out mutually and thereby, the plating solution can be sprayed evenly on the through holes formed in the substrate.

Generally, a seam diameter in which an inside diameter does not decrease even when electrolytic plating is continued tends to increase as a current density is increased in the case of filling a through hole with a plated metal by performing electrolytic plating on a substrate in which the through hole is formed.

The reason why this seam diameter occurs is considered as follows. That is, the amount of circulating a plating solution in a through hole decreases as an inside diameter of the through hole is thinned by precipitation of a plated metal and a situation in which the amount of precipitation per unit time precipitated on inner wall surfaces of metal ions in the plating solution of the inside of the through hole becomes larger than the metal ion amount of the plating solution per unit time circulated in the through hole occurs. As a result of this, the metal ions in the plating solution circulated in the through hole are finally consumed in the vicinity of the peripheral edge of an opening of the through hole and the metal ions substantially disappear in the plating solution of the inside of the through hole and the seam diameter in which the inside diameter does not decrease even when electrolytic plating is continued is probably reached.

The fact that such a seam diameter tends to increase as a current density is increased is because the amount of consumption of the metal ions in the plating solution increases. As a result of this, the situation in which the amount of precipitation per unit time precipitated on the inner wall surfaces of the metal ions in the plating solution of the inside of the through hole becomes larger than the metal ion amount of the plating solution per unit time circulated in the through hole probably occurs earlier since the electrolytic plating was started as the current density is increased.

In this respect, in the invention, after electrolytic plating is started at a high current density higher than Constant Current Density capable of fully filling a through hole when the electrolytic plating is performed with a current density held constant, the current density is changed to a current density lower than the high current density by the time of reaching a seam diameter at the current density started. As a result of this, the seam diameter in the electrolytic plating can be thinned sequentially and the through hole can be filled with a plated metal.

Further, in the invention, filling of a through hole with a plated metal is started by electrolytic plating of a high current density higher than Constant Current Density, so that time taken to complete the filling of the through hole with the plated metal can be reduced as compared with the case of filling a through hole with a plated metal by continuously performing electrolytic plating of Constant Current Density.

Also, Constant Current Density and a high current density of electrolytic plating can easily be previously obtained experimentally and also, timing of being changed from the high current density to a low current density can easily be managed by time elapsed since a start of the electrolytic plating if the timing is previously obtained experimentally.

As a result of that, according to the invention, combined with the fact that a related-art electrolytic plating apparatus can be appropriated as an electrolytic plating apparatus, time taken to complete filling of a through hole with a plated metal can be reduced and it is easy to use industrially.

DETAILED DESCRIPTION

Figure 1:
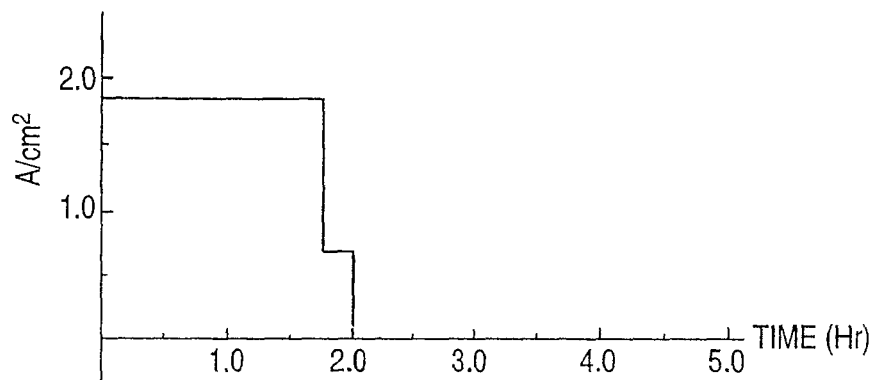
FIG. 1 is a graph showing a change in a current density with time in electrolytic copper plating for filling through holes with the same inside diameter formed in a substrate with a plated copper.
Figure 1:
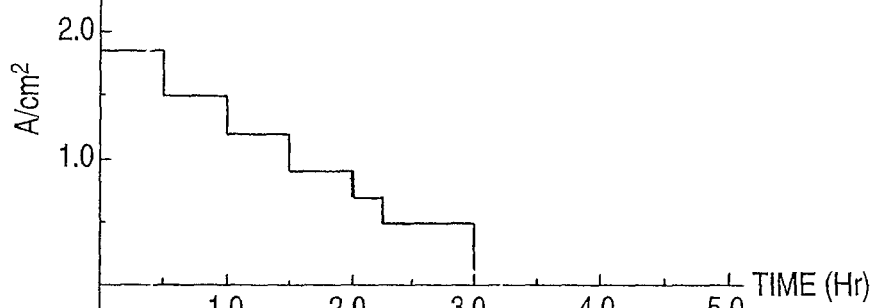
Figure 1:
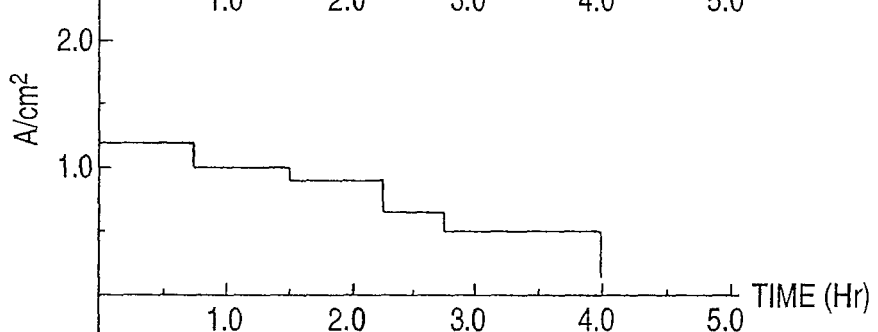
Figure 1:
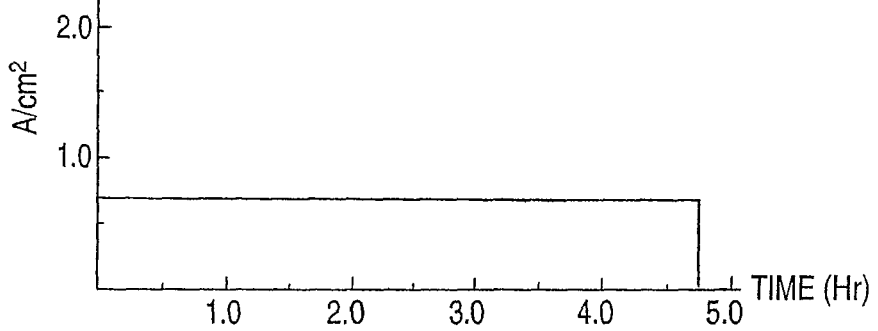

In the invention, it is necessary to start electrolytic plating by a high current density higher than Constant Current Density capable of fully filling a through hole when the electrolytic plating is performed with a current density held constant.

It is preferable that this Constant Current Density should be a current density in consideration of variations in the inside diameter etc. when plural through holes with the same diameter are formed in a substrate.

Also, it is preferable to adopt a high current density at which an initial value of throwing power represented by a ratio $[(t_{in}/t_{out}) \times 100]$ between a thickness $(t_{in})$ of a plated metal layer formed on an inner wall surface of a through hole and a thickness $(t_{out})$ of a plated metal layer formed on a substrate surface in which this through hole is opened becomes 90% or more as the high current density higher than such Constant Current Density. In electrolytic plating of such a high current density, from the beginning of a start of the electrolytic plating, a thickness of a plated metal layer formed on an inner wall surface of a through hole can be made almost equal to a thickness of a plated metal layer formed on a substrate surface in the vicinity of the opening peripheral edge of the through hole and the through hole can surely be filled with a plated metal.

Further, in the invention, it is important to continue the electrolytic plating by being changed to a current density lower than this high current density by the time of reaching formation of a seam diameter in which an inside diameter does not decrease even when the electrolytic plating is continued after the electrolytic plating at the high current density is started. This is because by the change in such a current density, the seam diameter can be thinned to continue the electrolytic plating. It is preferable to decide timing of the change in this current density in consideration of variations in the inside diameter etc. when plural through holes with the same diameter are formed in a substrate, and the timing can be managed by time elapsed since the start of the electrolytic plating.

Also, the change in the current density may be made continuously or stepwise, and it is easy to make the change stepwise from the initial high current density to a current density of the Constant Current Density or less.

In addition, this seam diameter is experimentally obtained by performing electrolytic plating on a substrate in which a through hole filled is formed at a current density held constant.

When electrolytic plating is performed on a substrate in which plural through holes with the same diameter are formed and the through holes are filled with a plated metal, for example, the through hole formed in the substrate with a thickness of 300 μm is set at a through hole with an inside diameter of 60 to 70 μm and when the inside diameter reaches about 10 μm by a plated metal layer formed on an inner wall surface of this through hole, a current density is set at 0.9 A/cm² or less and thereby, the through hole can surely be filled with the plated metal.

Figure 3:
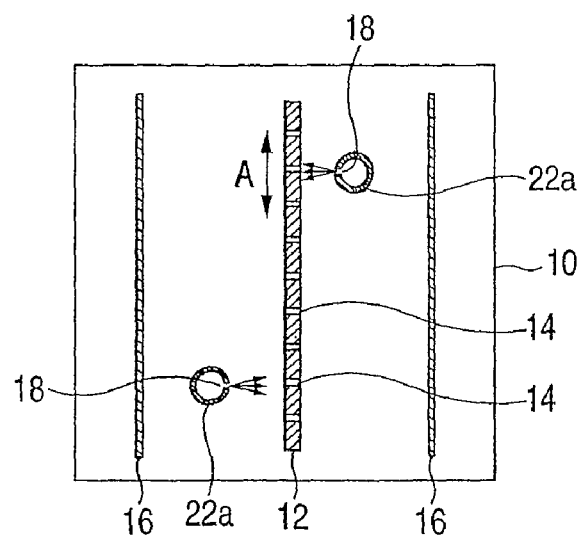
FIG. 3 is an explanatory diagram explaining a plating apparatus for performing electrolytic copper plating of the changes in the current densities shown in FIGS. 1 and 2 with time on a substrate.
Figure 3:
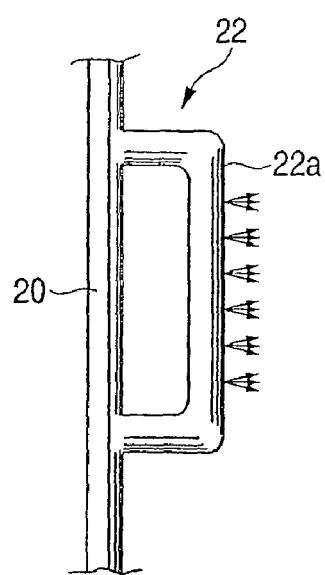
Figure 4:
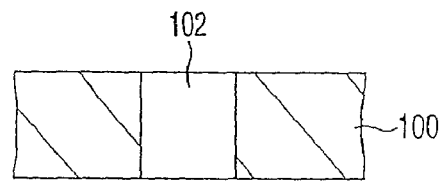
FIG. 4 is a process diagram explaining a related-art method for filling a through hole.
Figure 4:
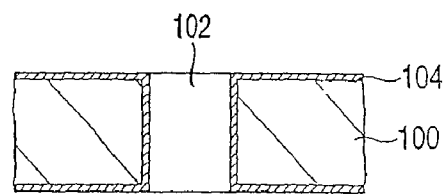
Figure 4:
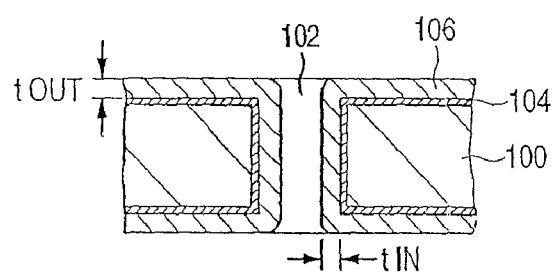
Figure 4:
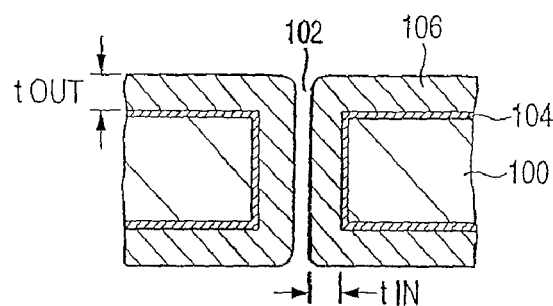
Figure 4:
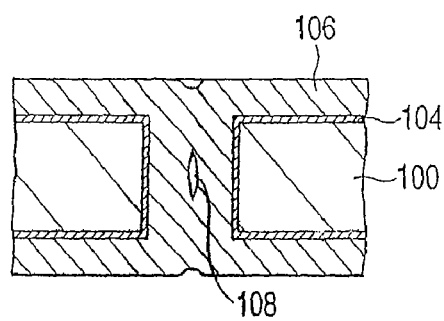
Figure 5:
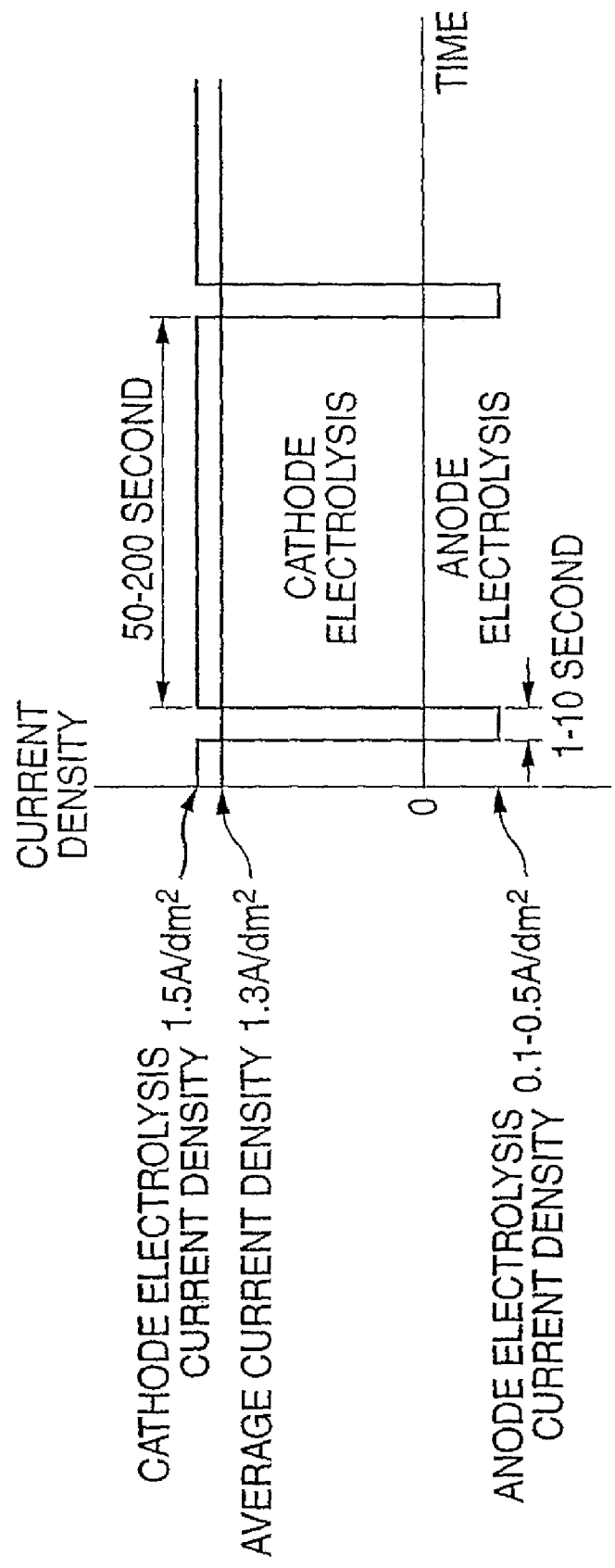
FIG. 5 is an explanatory diagram explaining an improved method for improving the method for filling the through hole shown in FIG. 4.

A plating apparatus shown in FIG. 3 can preferably be used as a plating apparatus for implementing such a method for filling the through hole according to the invention.

In the plating apparatus shown in FIG. 3, a substrate 12 in which plural through holes 14, 14 . . . with the same diameter are formed is immersed in a plating solution retained in a plating bath 10 as shown in FIG. 3(a). A surface including inner wall surfaces of the through holes 14 of this substrate 12 is covered with a metal thin film layer (not shown) formed by electroless plating and is electrically connected to a cathode of a DC power source (not shown).

Anodes 16, 16 are arranged in both sides of such a substrate 12, and plural injection openings 18, 18 . . . for spraying a plating solution on each of the plated target surfaces of the substrate 12 are formed along each of the plated target surfaces of the substrate 12 between the anode 16 and one side of the substrate 12 and between the anode 16 and the other side of the substrate 12.

A plurality of the injection openings 18, 18 . . . are formed in a parallel part 22a disposed in parallel with the plated target surfaces of the substrate 12 of a second supply pipe 22 disposed in U shape in a first supply pipe 20 for supplying the plating solution as shown in FIG. 3(b). As a result of this, pressures of plating solutions applied to each of the injection openings 18, 18 . . . formed in the parallel part 22a of the second supply pipe 22 can be almost equalized and the plating solutions of the almost equal amount can be injected from each of the injection openings 18.

Further, as shown in FIG. 3(a), the parallel part 22a of the second supply pipe 22 arranged in both sides of the substrate 12 is disposed in a position in which jets of the plating solutions injected from the injection openings 18, 18 do not cancel out mutually, and the substrate 12 is also swung as shown by an arrow A.

As a result of this, according to the plating apparatus shown in FIG. 3, the plating solutions can be injected evenly on the plated target surfaces of both sides of the substrate 12.

Using the plating apparatus shown in FIG. 3, electrolytic copper plating was performed on the substrate 12 in which plural through holes with inside diameters of 60 μm were formed by changes in current densities of FIGS. 1(a) to 1(d) with time and each of the through holes was filled with a plated copper.

When electrolytic plating is performed with a current density held constant in this through hole, Constant Current Density capable of fully filling the through hole is 0.7 A/cm² as shown in FIG. 1(d). In electrolytic copper plating at the Constant Current Density shown in FIG. 1(d), time necessary to complete filling of the through hole with the plated copper was as long as 4.75 hours.

On the other hand, in electrolytic copper plating of a change in a current density shown in FIG. 1(a) with time, a current density at the time of starting the electrolytic copper plating was set at 1.84 A/cm² and at a point in time when 1.75 hours have elapsed since the electrolytic copper plating was started, the current density was decreased to 0.7 A/cm² and the electrolytic copper plating was continued for 0.25 hour and was ended.

In this electrolytic copper plating shown in FIG. 1(a), time taken to end the electrolytic copper plating could be reduced to 2 hours, but a void was formed inside a through hole filled with a plated copper.

In such a change in the current density shown in FIG. 1(a) with time, an inside diameter of a through hole has already been formed thinner than a seam diameter of a through hole with a current density of 1.84 A/cm² at a point in time of decreasing the current density. As a result of this, even when the current density is decreased and the electrolytic copper plating is performed, this seam diameter cannot be eliminated completely and a void is probably left.

In electrolytic copper plating of a change in a current density shown in FIG. 1(b) with time with respect to change in the current density shown in FIG. 1(a) with time, a current density at the time of starting the electrolytic copper plating was set at 1.84 A/cm² and at a point in time when 0.5 hour has elapsed since the electrolytic copper plating was started, the current density was decreased to 1.5 A/cm² and then the current density was decreased sequentially at two stages of 1.25 A/cm² and 1.0 A/cm² and was set at 0.7 A/cm² which is Constant Current Density at a point in time when 2 hours have elapsed since the electrolytic copper plating was started. Further, the current density was set at 0.5 A/cm² which is a current density lower than the Constant Current Density at a point in time when 2.25 hours have elapsed since the electrolytic copper plating was started. In the electrolytic copper plating of the change in the current density shown in FIG. 1(b) with time, electrolytic copper plating time was 3 hours. The electrolytic copper plating time could be reduced by about 37% as compared with the electrolytic copper plating time shown in FIG. 1(d).

A state of filling of the through holes with the plated copper in the substrate in which the electrolytic copper plating was ended was checked, and the through holes were sufficiently filled with the plated copper without detecting a defect such as a void.

Next, in electrolytic copper plating of a change in a current density shown in FIG. 1(c) with time, a current density at the time of starting the electrolytic copper plating was decreased to 1.2 A/cm² with respect to the change in the current density shown in FIG. 1(b) with time. This current density at the time of starting the electrolytic copper plating was decreased sequentially at two stages of 1.0 A/cm² and 0.9 A/cm² and was set at 0.7 A/cm² which is Constant Current Density at a point in time when 2.25 hours have elapsed since the electrolytic copper plating was started.

In the electrolytic copper plating of the change in the current density shown in FIG. 1(c) with time, the current density was further set at 0.5 A/cm² which is a current density lower than the Constant Current Density at a point in time when 2.75 hours have elapsed since the electrolytic copper plating was started. In the electrolytic copper plating of the change in the current density shown in FIG. 1(c) with time, electrolytic copper plating time was 4 hours. The electrolytic copper plating time could be reduced by about 16% as compared with the electrolytic copper plating time shown in FIG. 1(d).

A state of filling of the through holes with the plated copper in the substrate in which the electrolytic copper plating was ended was checked, and the through holes were sufficiently filled with the plated copper without detecting a defect such as a void.

In the electrolytic copper plating of changes in current densities shown in FIGS. 1(b) and 1(c) with time, with respect to the substrate 12 in which plural through holes with inside diameters of 40 μm were formed, the through holes could be sufficiently filled with the plated copper without detecting a defect such as a void.

As a result of examining initial throwing power in the electrolytic copper plating of changes in current densities shown in FIGS. 1(b) and 1(c) with time herein, a ratio [($t_{in}/t_{out}$)×100] between a thickness ($t_{in}$) of a plated metal layer formed on an inner wall surface of a through hole and a thickness ($t_{out}$) of a plated metal layer formed on a substrate surface in which this through hole was opened was a value close to 90% when an initial high current density of FIG. 1(b) was 1.84 A/cm².

On the other hand, a ratio [($t_{in}/t_{out}$)×100] between a thickness ($t_{in}$) of a plated metal layer formed on an inner wall surface of a through hole and a thickness ($t_{out}$) of a plated metal layer formed on a substrate surface in which this through hole was opened was 95% or more when an initial high current density of FIG. 1(c) was 1.2 ASD.

In addition, according to the electrolytic copper plating of the Constant Current Density shown in FIG. 1(d), with respect to the substrate 12 in which plural through holes with inside diameters of 40 μm were formed, the through holes could be sufficiently filled with the plated copper without detecting a defect such as a void by performing the electrolytic copper plating continuously for 4.75 hours.

In the description described above, the electrolytic plating has been performed on the substrate 12 in which the through holes with the same inside diameter are formed, but through holes can similarly be filled with a plated metal by electrolytic plating on a substrate 12 in which through holes with different inside diameters are formed.

However, each of the through holes with different inside diameters can surely be filled with the plated metal by completing filling of a large inside diameter through hole group made of the through holes having large inside diameters with a plated metal after filling of a small inside diameter through hole group made of the through holes having small inside diameters formed in the substrate 12 with a plated metal is completed.

That is, the through holes of the large inside diameter through hole group are also filled with the plated metal while the through holes of the small inside diameter through hole group are filled with the plated metal. However, a current density of the plated metal of the small inside diameter through hole group is normally lower than Constant Current Density of the large inside diameter through hole group. As a result of this, at a point in time of completing filling of the small inside diameter through hole group with the plated metal, filling of the large inside diameter through hole group with the plated metal is not completed and the inside diameters of the through holes of the large inside diameter through hole group are thinned.

The current density best suitable to fill the large inside diameter through hole group with the plated metal can be set in the case of filling the large inside diameter through hole group with the plated metal after filling of the small inside diameter through hole group with the plated metal is completed.

In this case, electrolytic plating of the small inside diameter through hole group is performed while a current density is decreased sequentially from its high current density and after filling of the small inside diameter through hole group with the plated metal is completed, the current density is changed to a current density higher than the filling current density at which the filling of the small inside diameter through hole group is completed and subsequently electrolytic plating of the large inside diameter through hole group is performed while its current density is decreased sequentially from the high current density and filling of the large inside diameter through hole group with the plated metal is completed and thereby, electrolytic plating time can be reduced.

Here, a difference between inside diameters of through holes forming the same through hole group is set at less than 10 μm and thereby, filling of all the through holes forming the same through hole group with the plated metal can be completed.

Thus, electrolytic plating performed on the substrate 12 in which through holes with different inside diameters are formed can be performed using the plating apparatus shown in FIG. 3.

Using the plating apparatus shown in FIG. 3, electrolytic copper plating was performed on a substrate 12 in which a small inside diameter through hole group is formed by through holes with inside diameters of 30 μm and 40 μm and a large inside diameter through hole group is formed by through holes with inside diameters of 60 μm and 70 μm.

A Constant Current Density for the through holes with the inside diameters of 30 μm, 40 μm, 60 μm and 70 μm formed in the substrate 12 is 0.7 A/cm².

Figure 2:
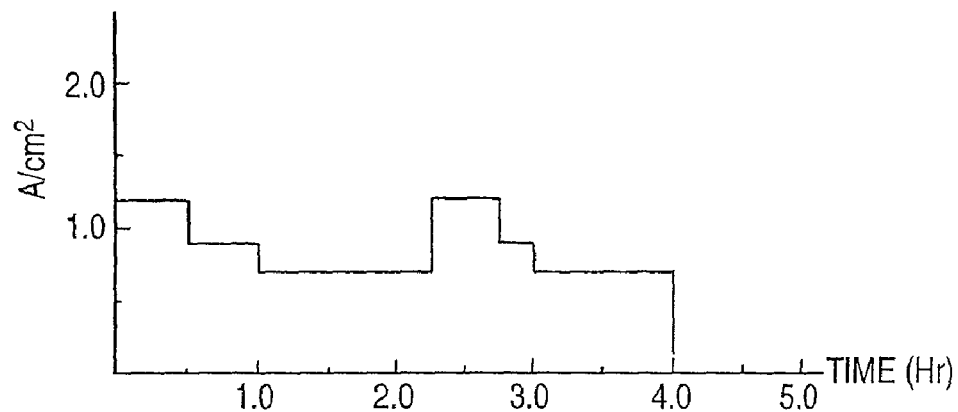
FIG. 2 is a graph showing a change in a current density with time in electrolytic copper plating for filling through holes with different inside diameters formed in a substrate with a plated copper.

A change in a current density in this electrolytic copper plating with time is shown in FIG. 2. In the change in the current density shown in FIG. 2 with time, a high current density at the time of starting the electrolytic copper plating was set at 1.2 A/cm² and at a point in time when 0.5 hour has elapsed since the electrolytic copper plating was started, the current density was set at 0.9 A/cm² and further at a point in time when 1 hour has elapsed since the electrolytic copper plating was started, the current density was set at 0.7 A/cm² and was continued until 2.25 hours have elapsed since the electrolytic copper plating was started. By this series of the changes in the current density with time, filling of the small inside diameter through hole group with a plated copper was completed. A filling current density of the small inside diameter through hole group is 0.7 A/cm².

At a point in time when 2.25 hours have elapsed since the electrolytic copper plating was started, the current density was again increased to 1.2 A/cm² higher than the filling current density of the small inside diameter through hole group and at a point in time when 2.75 hours have elapsed since the electrolytic copper plating was started, the current density was decreased to 0.9 A/cm² and then at a point in time when 3 hours have elapsed since the electrolytic copper plating was started, the current density was decreased to 0.7 A/cm² and at a point in time when 4 hours have elapsed since the electrolytic copper plating was started, the electrolytic copper plating was ended. By a series of the changes in the current density with time ranging from a point in time of again increasing this current density to the end of the electrolytic copper plating, filling of the large inside diameter through hole group with a plated copper was completed.

Then, a state of filling of the through holes with the plated copper in the substrate 12 in which the electrolytic copper plating was ended was checked, and the through holes were sufficiently filled with the plated copper without detecting a defect such as a void.

What is claimed is:

1. A method for filling a through hole formed in a substrate with a plated metal by electrolytic plating, the method comprising steps of:
    starting the electrolytic plating by a high current density higher than a Constant Current Density that is capable of fully filling the through hole when the electrolytic plating is performed with a current density held constant as a current density of said electrolytic plating; and
    continuing the electrolytic plating by being changed to a low current density lower than the high current density after at least 0.5 hour has elapsed since the electrolytic plating was started and by the time of reaching formation of a seam diameter in which an inside diameter does not decrease even when the electrolytic plating is continued after the electrolytic plating at the high current density is started,
    wherein the through hole has an inside diameter of one of 30 μm, 40 μm, and 60 to 70 μm, and the range of current density between the high current density and the low current density applied during the filling of the through hole is between 0.50-1.84 A/cm².

2. A method for filling a through hole as claimed in claim 1, wherein a high current density at which an initial value of throwing power represented by a ratio $[(t_{in}/t_{out}) \times 100]$ between a thickness ($t_{in}$) of a plated metal layer formed on an inner wall surface of a through hole and a thickness ($t_{out}$) of a plated metal layer formed on a substrate surface in which the through hole is opened becomes 90% or more is adopted as the high current density.

3. A method for filling a through hole as claimed in claim 1, wherein a current density is changed stepwise from an initial high current density to a current density of Constant Current Density or less.

4. A method for filling a through hole as in claim 1, wherein the through hole is set at a through hole with an inside diameter of 60 to 70 μm and when the inside diameter reaches about 10 μm by a plated metal layer formed on an inner wall surface of the through hole, a current density is set at 0.9 A/cm² or less.

5. A method for filling a through hole as in claim 1, wherein a substrate in which plural through holes with the same inside diameter are formed is used as the substrate.

6. A method for filling a through hole as in claim 1, wherein a substrate in which plural through holes with different inside diameters are formed is used as the substrate and filling of a large inside diameter through hole group made of the through holes having large inside diameters with a plated metal is completed after filling of a small inside diameter through hole group made of the through holes having small inside diameters of the substrate with a plated metal is completed.

7. A method for filling a through hole as claimed in claim 6, wherein electrolytic plating of the small inside diameter through hole group is performed while its current density is decreased sequentially from a high current density and after filling of the small inside diameter through hole group with a plated metal is completed, the current density is changed to a current density higher than the filling current density at which the filling of the small inside diameter through hole group is completed and subsequently electrolytic plating of the large inside diameter through hole group is performed while its current density is decreased sequentially from the high current density, and filling of the large inside diameter through hole group with a plated metal is completed.

8. A method for filling a through hole as claimed in claim 6, wherein a difference between inside diameters of through holes forming the same through hole group is set at less than 10 μm.

9. A method for filling a through hole as in claim 6, wherein a difference between an inside diameter of a through hole with the maximum inside diameter of the small inside diameter through hole group and an inside diameter of a through hole with the minimum inside diameter of the large inside diameter through hole group is set at 10 μm or more.

10. A method for filling a through hole as in claim 1, wherein in the case of performing electrolytic plating while a plating solution is sprayed on a plated target surface of the substrate, the plating solution is sprayed from plural injection openings formed in a parallel part disposed in parallel with the plated target surface of a second supply pipe disposed in U shape in a first supply pipe for supplying the plating solution.

11. A method for filling a through hole as claimed in claim 10, wherein parallel parts of a second supply pipe in which plural injection openings are formed are arranged in both sides of the substrate so that a plating solution can be sprayed on plated target surfaces of both sides of the substrate and also, each of the parallel parts is disposed in a position in which jets of the plating solutions injected from the injection openings do not cancel out mutually.

* * * * *